(12) United States Patent
Cheah et al.

(10) Patent No.: US 9,312,375 B2
(45) Date of Patent: *Apr. 12, 2016

(54) III-NITRIDE DEVICE WITH SOLDERABLE FRONT METAL

(71) Applicant: International Rectifier Corporation, El Segundo, CA (US)

(72) Inventors: Chuan Cheah, Torrance, CA (US); Michael A. Briere, Scottsdale, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/505,417

(22) Filed: Oct. 2, 2014

(65) Prior Publication Data

US 2015/0014703 A1    Jan. 15, 2015

Related U.S. Application Data

(63) Continuation of application No. 13/804,395, filed on Mar. 14, 2013, now Pat. No. 8,853,744, which is a continuation of application No. 13/018,780, filed on Feb. 1, 2011, now Pat. No. 8,399,912.

(60) Provisional application No. 61/337,924, filed on Feb. 16, 2010.

(51) Int. Cl.
*H01L 29/66*    (2006.01)
*H01L 29/778*   (2006.01)
(Continued)

(52) U.S. Cl.
CPC .......... *H01L 29/7787* (2013.01); *H01L 23/293* (2013.01); *H01L 23/4824* (2013.01); *H01L 24/05* (2013.01); *H01L 24/06* (2013.01); *H01L 24/29* (2013.01); *H01L 24/30* (2013.01); *H01L 24/32* (2013.01); *H01L 24/33* (2013.01); *H01L 27/088* (2013.01); *H01L 29/201* (2013.01); *H01L 29/2003* (2013.01); *H01L 29/205* (2013.01); *H01L 29/4175* (2013.01); *H01L 29/41758* (2013.01); *H01L 29/452* (2013.01); *H01L 2224/02166* (2013.01); *H01L 2224/0401* (2013.01); *H01L 2224/04026* (2013.01); *H01L 2224/056* (2013.01); *H01L 2224/05022* (2013.01); *H01L 2224/05082* (2013.01); *H01L 2224/05155* (2013.01);
(Continued)

(58) Field of Classification Search
CPC ................... H01L 29/66318; H01L 29/66431; H01L 29/66462; H01L 29/778; H01L 29/7783
USPC ................... 257/76, 194, E29.081, E29.089, 257/E29.246
See application file for complete search history.

(56) References Cited

U.S. PATENT DOCUMENTS 8,399,912 B2 *   3/2013   Cheah et al. ............ 257/194
8,853,744 B2 *  10/2014   Cheah et al. ............ 257/194

*Primary Examiner* — Tan N Tran
(74) *Attorney, Agent, or Firm* — Farjami & Farjami LLP

(57) ABSTRACT

Some exemplary embodiments of a III-nitride power device including a HEMT with multiple interconnect metal layers and a solderable front metal structure using solder bars for external circuit connections have been disclosed. The solderable front metal structure may comprise a tri-metal such as TiNiAg, and may be configured to expose source and drain contacts of the HEMT as alternating elongated digits or bars. Additionally, a single package may integrate multiple such HEMTs wherein the front metal structures expose alternating interdigitated source and drain contacts, which may be advantageous for DC-DC power conversion circuit designs using III-nitride devices. By using solder bars for external circuit connections, lateral conduction is enabled, thereby advantageously reducing device Rdson.

20 Claims, 5 Drawing Sheets

(51) Int. Cl.
*H01L 23/29* (2006.01)
*H01L 23/482* (2006.01)
*H01L 23/00* (2006.01)
*H01L 29/20* (2006.01)
*H01L 27/088* (2006.01)
*H01L 29/201* (2006.01)
*H01L 29/205* (2006.01)
*H01L 29/417* (2006.01)
*H01L 29/45* (2006.01)

(52) U.S. Cl.
CPC ............... *H01L 2224/05166* (2013.01); *H01L 2224/05555* (2013.01); *H01L 2224/05556* (2013.01); *H01L 2224/05563* (2013.01); *H01L 2224/05567* (2013.01); *H01L 2224/05639* (2013.01); *H01L 2224/0603* (2013.01); *H01L 2224/0615* (2013.01); *H01L 2224/0616* (2013.01); *H01L 2224/06177* (2013.01); *H01L 2224/131* (2013.01); *H01L 2224/291* (2013.01); *H01L 2224/29005* (2013.01); *H01L 2224/29014* (2013.01); *H01L 2224/2919* (2013.01); *H01L 2224/29023* (2013.01); *H01L 2224/29101* (2013.01); *H01L 2224/3003* (2013.01); *H01L 2224/3015* (2013.01); *H01L 2224/30177* (2013.01); *H01L 2924/01004* (2013.01); *H01L 2924/014* (2013.01); *H01L 2924/01006* (2013.01); *H01L 2924/01013* (2013.01); *H01L 2924/01014* (2013.01); *H01L 2924/01022* (2013.01); *H01L 2924/01029* (2013.01); *H01L 2924/01033* (2013.01); *H01L 2924/01047* (2013.01); *H01L 2924/01082* (2013.01); *H01L 2924/04941* (2013.01); *H01L 2924/0665* (2013.01); *H01L 2924/10253* (2013.01); *H01L 2924/1306* (2013.01); *H01L 2924/13064* (2013.01); *H01L 2924/19041* (2013.01)

US 9,312,375 B2

III-NITRIDE DEVICE WITH SOLDERABLE FRONT METAL

This is a continuation of application Ser. No. 13/804,395 filed Mar. 14, 2013.

This is a continuation of application Ser. No. 13/018,780 filed Feb. 01, 2011.

RELATED APPLICATIONS

The present application claims the benefit of and priority to a pending provisional application entitled "III-Nitride Power Device Having Solderable Front Metal with Source and Drain Solder Bars," Ser. No. 61/337,924 filed on Feb. 16, 2010. The disclosure in that pending provisional application is hereby incorporated fully by reference into the present application.

BACKGROUND OF THE INVENTION

1. Field of the Invention

The present invention relates generally to the field of semiconductor devices and more particularly to the packaging of semiconductor devices.

2. Background Art

III-nitride power devices such as Gallium Nitride high electron mobility transistors or GaN HEMTs are known in the art for high power performance. However, the performance of such devices has been constrained by the use of conventional interconnect schemes. Thus, GaN HEMT devices utilizing multiple interconnect metal layers have been developed in the art.

Such multi-level III-nitride power devices have used conventional integration methods, such as solder ball arrays, for integration onto a support surface such as a printed circuit board. In particular, when integrating reduced footprint packages, it is often expedient to use solder ball arrays to prevent problems such as solder bridging. Unfortunately, such conventional integration methods increase the Rdson, or the "on resistance," of the device by limiting the flow of current through the circuit, thereby negating the advantages of using multi-level III-nitride power devices in the first instance.

Thus, a solution is needed for integrating multi-level III-nitride power devices onto support surfaces while reducing Rdson, thereby leveraging the high power performance capabilities of III-nitride power devices.

SUMMARY OF THE INVENTION

A III-nitride power device with solderable front metal, substantially as shown in and/or described in connection with at least one of the figures, as set forth more completely in the claims.

DETAILED DESCRIPTION OF THE INVENTION

The present invention is directed to a III-nitride power device with solderable front metal. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. Further, to promote clarity and readability, drawings may not be shown exactly to scale. To maintain brevity, other embodiments of the present invention are not specifically described in the present application and are not specifically illustrated by the present drawings.

Figure 1:
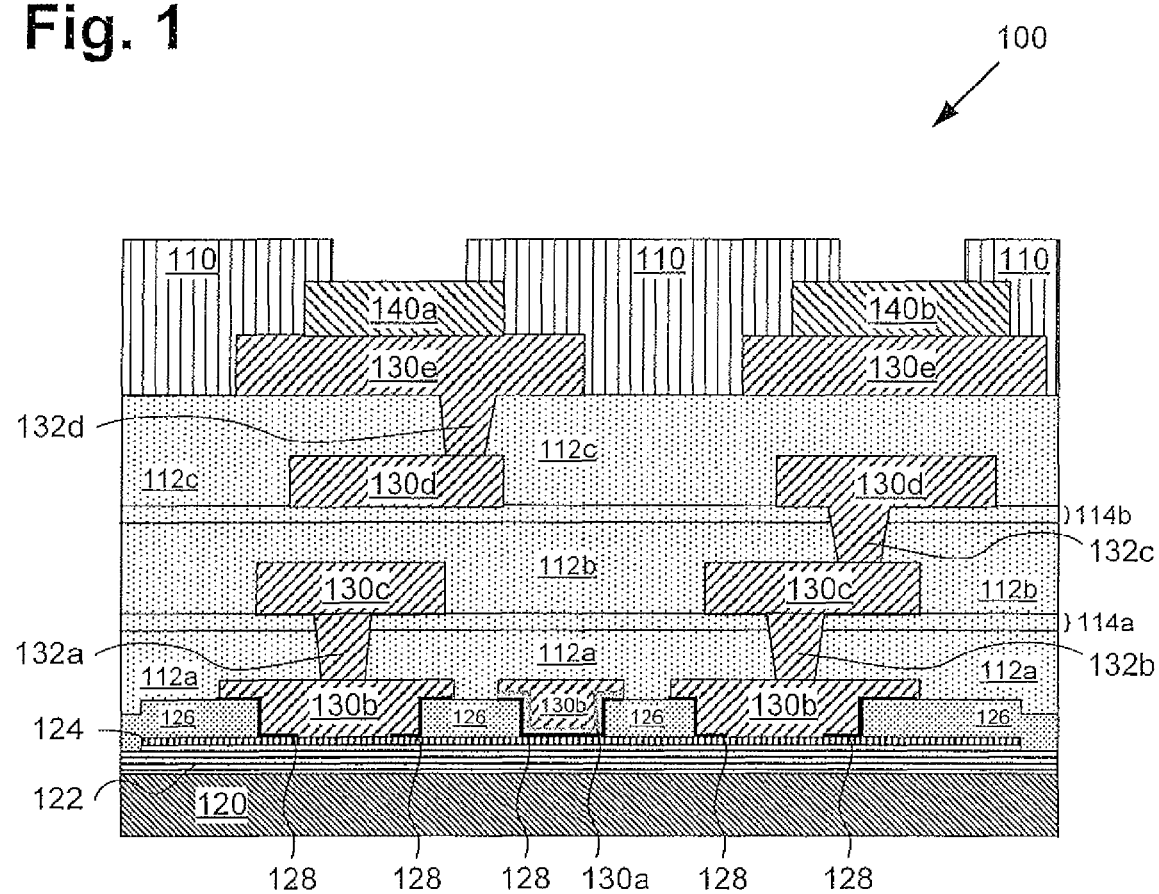
FIG. 1 illustrates a cross-sectional view of a multi-level III-nitride power device according to an embodiment of the invention.

Referring to FIG. 1, a cross-sectional view of an exemplary multi-level III-nitride power device according to one embodiment of the invention is illustrated. In FIG. 1, power device 100 can comprise a multi-level AlGaN/GaN High Electron Mobility Transistor (HEMT) or Heterojunction Field Effect Transistor (HFET). As illustrated in FIG. 1, power device 100 includes, among other elements not shown, passivation 110, solderable front metals (SFM) 140a and 140b, metal layers 130a, 130b, 130c, 130d and 130e, intermetal dielectric (IMD) layers 112a, 112b and 112c, Tetraethooxysilane (TEOS) layers 114a and 114b, vias 132a, 132b, 132c and 132d, Aluminum Gallium Nitride (AlGaN) layer 124, Gallium Nitride (GaN) layer 122, Silicon substrate 120, field nitride 126, and gate nitride 128.

In FIG. 1, metal layer 130a may comprise, for example, titanium nitride, or another suitable gate metal. Metal layer 130e may comprise, for example, aluminum, or any other suitable metal. IMD layers 112a-112c may comprise, for example, TEOS. Passivation 110 may comprise, for example, epoxy, polyimide, silicon oxide, or another suitable material. Epoxy may be preferable to provide sufficient thickness, such as 20 to 25 microns, for maintaining structural integrity when soldering the die. As shown in FIG. 1, passivation 110 encloses and extends around SFM 140a and 140b, for example by about five microns. In one embodiment, passivation 110 may be configured to leave a soldering surface of approximately 200 microns wide for matching to the width of SFM 140a and 140b. SFM 140a and 140b, as the name suggests, are configured such that the top or front exposed metal is readily solderable. For example, SFM 140a and 140b may each form a tri-metal with metal layer 130e in a stacked configuration, suitable for use with high-lead solder such as 92.5% lead solder. One such tri-metal may comprise TiNiAg, where metal layer 130e comprises aluminum, and SFM 140a and 140b each comprise Titanium as a bottom layer, Nickel as the middle layer, and Silver as a top layer. The Titanium of the tri-metal SFM is effective as a barrier layer interfacing with aluminum metal layer 130e, while the Silver dissolves into ions to provide increased conductivity when soldering, leaving Nickel as the contact layer.

As shown in FIG. 1, AlGaN layer 124 and GaN layer 122 are disposed on top of a Silicon substrate 120 to form a high mobility two-dimensional electronic gas (2DEG). GaN based III-nitride power devices are advantageous due to, for example, inherent high break-down characteristics particularly suited for power management applications such as DC-DC converters. FIG. 1 shows power device 100 configured as a four interconnect metal layer power device, but alternative embodiments may comprise a power device with a different number of interconnect metal layers. In the particular cross section shown in FIG. 1, vias 132a and 132b can seen connecting metal layer 130b to metal layer 130c, via 132c can be seen connecting metal layer 130c to metal layer 130d, and via 132d can be seen connecting metal layer 130d to metal layer 130e. While it may appear that insufficient vias are provided for proper connectivity, if the cross section of FIG. 1 were to be taken at a different depth, additional vias would be made visible to provide the necessary connections to fully connect the gate, source, and drain connections of the III-nitride device externally or to the outside world. By using the multi-interconnect metal layer structure and the SFM 140a and 140b of III-nitride power device 100 shown in FIG. 1, efficient movement of current from source to drain is enabled, thereby advantageously minimizing on resistance (Rdson), which can be critical due to high currents passing through the source and drain of III-nitride power device 100.

Figure 2:
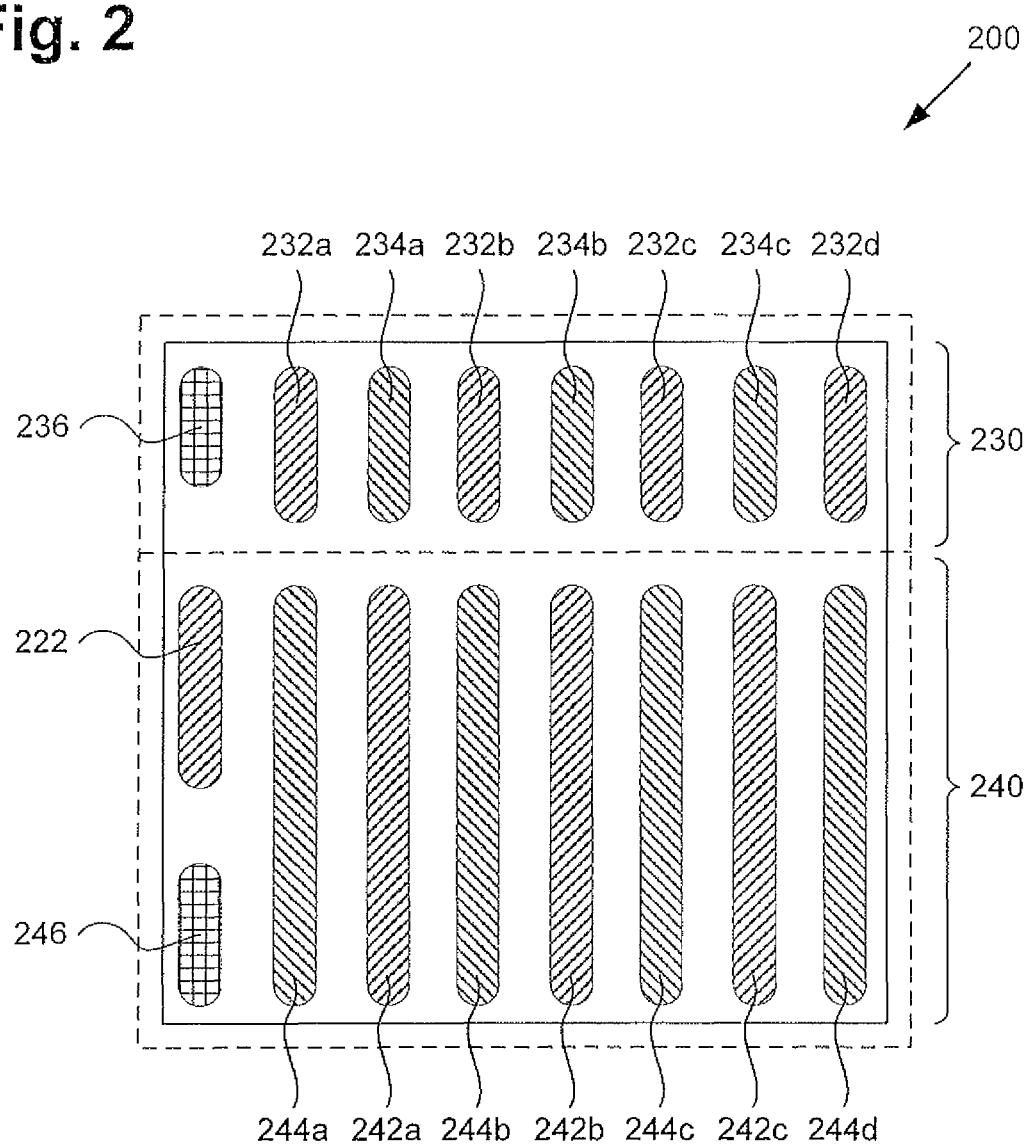
FIG. 2 illustrates a top view of a multi-level III-nitride power device according to an embodiment of the invention.

Referring now to FIG. 2, a top view of an exemplary multi-level III-nitride power device in accordance with one embodiment of the present invention is shown. In many power applications, it may be desirable to integrate several HFETs (or HEMTs) onto a single die. Thus, as shown in FIG. 2, power device 200 integrates two HFETs, a control FET 230 and a synch FET 240. In this example, control FET 230 includes gate digits 236, source digits 232a, 232b, 232c and 232d, and drain digits 234a, 234b and 234c. Synch FET 240 includes gate digit 246, source digits 222, 242a, 242b and 242c, and drain digits 244a, 244b, 244c and 244d. As shown in FIG. 2, power device 200 exposes the spaced alternating interdigitated source and drain digits from the SFMs on top of the die. These elongated digits may then be soldered to copper traces on a support board using long solder bars. In this fashion, soldering surface area is optimized relative to using conventional solder balls or conventional solder bumps, while minimizing solder bridging. Although eight columns of digits are shown in FIG. 2, alternative embodiments may use more or fewer digits according to application requirements.

Figure 3:
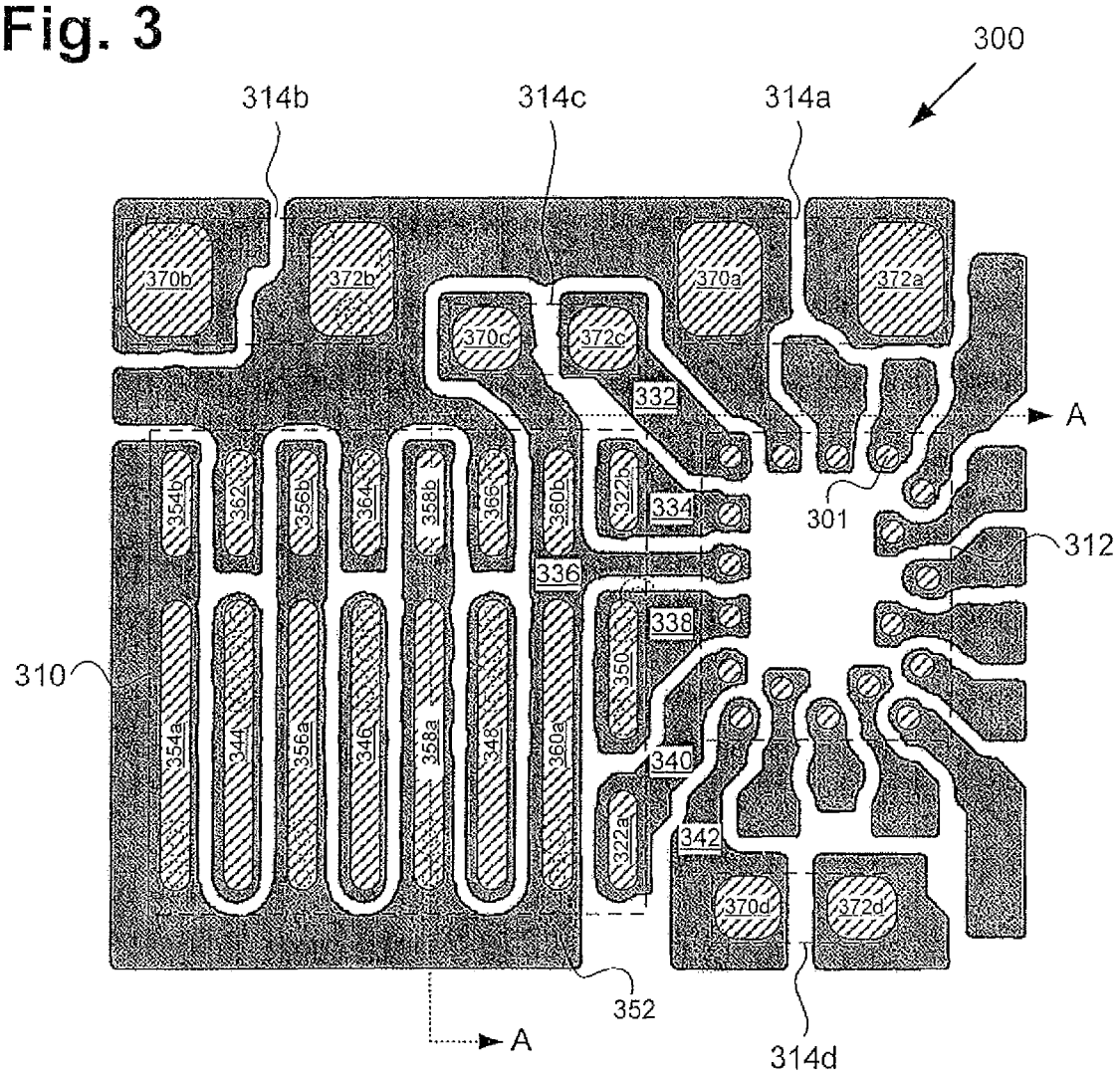
FIG. 3 illustrates a top view of a substrate for receiving a III-nitride power device according to an embodiment of the invention.

Referring now to FIG. 3, a top view of an exemplary substrate for receiving the exemplary III-nitride power device in accordance with one embodiment of the present invention is shown. As shown in FIG. 3, substrate 300 includes a cross-section A-A which can correspond to the cross-section shown in FIG. 4, discussed below. Substrate 300 may receive several components including III-nitride die 310 corresponding to power device 200 of FIG. 2, gate driver integrated circuit (IC) 312, and capacitors 314a, 314b, 314c and 314d. Pin 1 connection of gate driver IC 312 is indicated by solder pad 301, with pins numbering upwards in the clockwise direction. Gate driver IC 312 may comprise, for example, the IRD2010 driver IC available from International Rectifier. Substrate 300 further includes solder bars 354a, 354b, 356a, 356b, 358a, 358b, 360a, 360b, 344, 362, 346, 364, 348, 366, 322a, 322b, and 350, which may correspondingly receive the SFMs exposed by III-nitride die 310 corresponding to power device 200 when flipped onto substrate 300. The substrate may help position the SFMs by providing, for example, matched openings with 25 microns of empty padding on all sides for solder fill. The grey portions of substrate 300 below the solder bars are copper traces, which may be preferably 1 to 2 oz per square inch or thicker to improve conductivity and reduce resistance. Several vias such as via 352 are also shown throughout substrate 300, and may preferably comprise walls of at least 40 microns to improve conductivity and reduce resistance. The vias may route to external circuit connections such as to a printed circuit board. Although the vias are depicted in FIG. 3 as the same size, they may actually differ in size.

Solder bars 362, 364, and 366 will make contact to the SFMs that are connected to the drain of control FET 230, which receives Vin from gate driver IC 312. Solder bars 344, 346, 348 and 350 will make contact to the SFMs that are connected to the source of synch FET 240 or power ground (P-ground), distinguished from analog or signal ground.

While solder bars 344, 346, 348 and 350 may appear to be isolated, they are actually grounded together by vias to an unseen grounding layer. Solder bars 354a, 354b, 356a, 356b, 358a, 358b, 360a and 360b are connected to a switch node 336 which connects the source of control FET 230 to the drain of synch FET 240. Switch node 336 also functions as the "gate return" for control FET 230. Node 334 is connected to the gate of control FET 230, node 338 is connected to P-ground and also functions as the "gate return" for synch FET 240, and node 340 is connected to the gate of synch FET 240.

Node 332 connects gate driver IC 312 to capacitor 314c, which may comprise a bootstrap or boost (BST) capacitor. Node 342 connects gate driver IC 312 to capacitor 314d, which may comprise a bypass capacitor for filtering ripple noise. Capacitors 314a and 314b are also shown in FIG. 3, connected in parallel and receiving Vin from gate driver IC 312. As shown in FIG. 3, solder pads 370a through 370d and 372a through 372d are positioned appropriately on substrate 300 to receive capacitors 314a through 314d.

Figure 4:
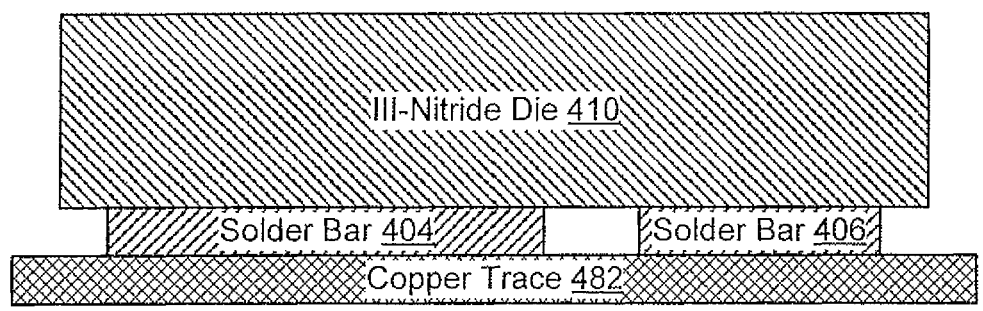
FIG. 4 illustrates a cross-sectional view of a multi-level III-nitride power device mounted on a substrate according to an embodiment of the invention.

Referring now to FIG. 4, a cross-sectional view of an exemplary multi-level III-nitride power device mounted on a substrate according to one embodiment of the invention is illustrated. As discussed above, the cross section of FIG. 4 is taken from cross section A-A of FIG. 3. III-Nitride die 410 is flipped, with the exposed SFM resting directly on solder bars 404 and 406. Switch node 336 of FIG. 3 is shorted through copper trace 482, which connects the drain of synch FET 240 resting on solder bar 404 and the source of control FET 230 resting on solder bar 406.

As can be seen in FIG. 4, using solder bars 404 and 406 running parallel with the SFM of III-nitride die 410 rather than using conventional solder balls or bumps provides greater surface area for conduction and heat dissipation, advantageously reducing Rdson. Furthermore, since solder bars 404 and 406 are continuous in lateral directions, current can be routed laterally through solder bars 404 and 406, further increasing conduction. In contrast, if conventional solder balls or bumps were utilized, then current could not travel in the lateral direction since the bails would introduce non-conductive gaps, requiring current to be rerouted through copper trace 482 or III-nitride die 410.

Figure 5:
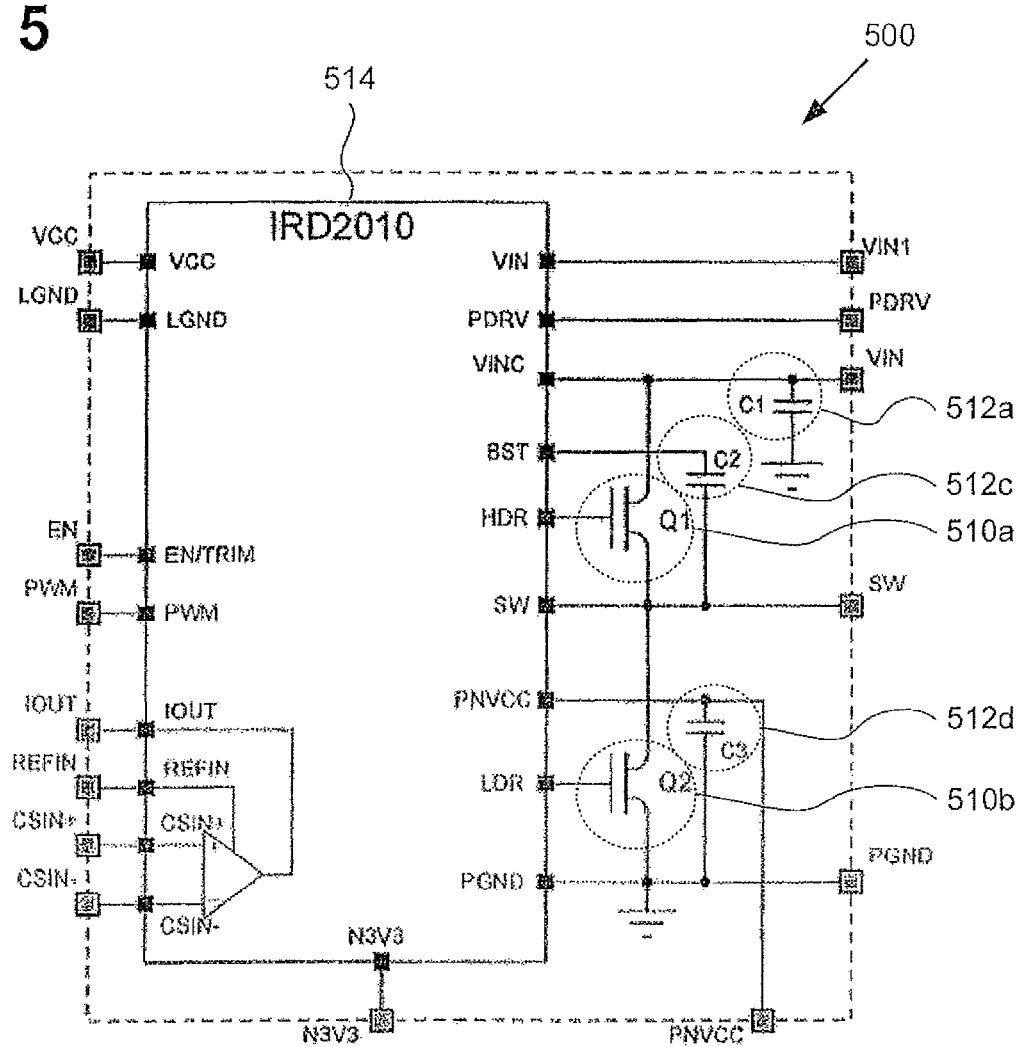
FIG. 5 illustrates a circuit diagram integrating a multi-level III-nitride power device according to an embodiment of the invention.

Referring now to FIG. 5, a circuit diagram integrating an exemplary multi-level III-nitride power device according to one embodiment of the invention is illustrated. Control PET 510a, labeled Q1, may correspond to control PET 230 of FIG. 2. Synch FET 510b, labeled Q2, may correspond to synch PET 240 of FIG. 2. Capacitor 512a, labeled C 1, may correspond to the parallel-connected capacitors 314a and 314b in FIG. 3. Capacitor 512c, labeled C2, may correspond to capacitor 314c in FIG. 3. Capacitor 512d, labeled C3, may correspond to capacitor 314d in FIG. 3. Gate driver IC 514, shown as an IRD2010 driver IC by International Rectifier, may correspond to gate driver IC 312 shown in FIG. 3.

As discussed above, the SFMs fabricated and integrated on the die of a III-nitride power device and connected to solder bars on the package substrate together minimize Rdson and therefore improve conductivity in the switch node (SW) between FETs 510a (Q1) and 510b (Q2), and enable power circuit 500 shown in FIG. 5, which can be, for example, a DC to DC buck converter (also referred to generally as a "DC-DC conversion circuit" in the present application), to operate more efficiently. Thus, as discussed above, in the embodiments of FIGS. 1 through 5, the invention achieves a III-nitride power device and package therefor that result in, among other things, enhanced thermal and conductivity performance including a reduced effective Rdson for the power transistors used therein.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. For example, conducting and non-conducting cells can have varying elements and configurations while still embodying the spirit of the present invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A III-nitride semiconductor device comprising:
a first III-nitride layer;
a second III-nitride layer forming a heterojunction with said first III-nitride layer;
a source and a drain over said second III-nitride layer;
a bottom metal layer over said second III-nitride layer, said bottom metal layer including a source contact over said source, and a drain contact over said drain;
a plurality of vias connecting said source contact and said drain contact to a top metal layer situated over said bottom metal layer;
a solderable front metal over said top metal layer.

2. The III-nitride semiconductor device of claim 1, wherein said solderable front metal comprises spaced elongated digits configured for external circuit connection.

3. The III-nitride semiconductor device of claim 2, wherein said spaced elongated digits alternately expose said source contact and said drain contact.

4. The III-nitride semiconductor device of claim 1, wherein said solderable front metal comprises solder bars.

5. The III-nitride semiconductor device of claim 1, wherein said III-nitride semiconductor device is a high electron mobility transistor (HEMT).

6. The III-nitride semiconductor device of claim 1, comprising a first transistor and a second transistor, wherein said solderable front metal exposes alternating interdigitated source and drain contacts of said first and second transistors.

7. The III-nitride semiconductor device of claim 1, further comprising a passivation on said top metal layer, said passivation surrounding said solderable front metal.

8. The III-nitride semiconductor device of claim 1, further comprising a passivation on said top metal layer, said passivation selected from the group consisting of epoxy, polyamide, and silicon oxide.

9. The III-nitride semiconductor device of claim 1, wherein said first III-nitride layer comprises GaN and wherein said second III-nitride layer comprises AlGaN.

10. The III-nitride semiconductor device of claim 1, wherein said solderable front metal comprises Titanium-Nickel-Silver (TiNiAg) tri-metal.

11. The III-nitride semiconductor device of claim 1, wherein said first III-nitride layer is on a silicon substrate.

12. The III-nitride semiconductor device of claim 1, wherein said solderable front metal is soldered with solder bars to conductive traces of a circuit board for external circuit connection.

13. The III-nitride semiconductor device of claim 1, wherein said solderable front metal is soldered with solder bars to conductive traces of a circuit board for implementing a DC-DC conversion circuit.

14. A III-nitride semiconductor device comprising:
a first high electron mobility transistor (HEMT) having multiple interconnect metal layers, said first HEMT including a solderable front metal on a top metal layer, said solderable front metal exposing a source contact and a drain contact of said first HEMT, wherein said solderable front metal is configured for external circuit connection.

15. The III-nitride semiconductor device of claim 14, further comprising a second HEMT, wherein said solderable front metal of said first HEMT and a solderable front metal of said second HEMT expose alternating interdigitated source and drain contacts.

16. The III-nitride semiconductor device of claim 14, further comprising a passivation on said top metal layer, said passivation selected from the group consisting of epoxy, polyamide, and silicon oxide.

17. The III-nitride semiconductor device of claim 14, wherein said first HEMT is an AlGaN/GaN HEMT.

18. The III-nitride semiconductor device of claim 14, wherein said solderable front metal comprises Titanium-Nickel-Silver (TiNiAg) tri-metal.

19. The III-nitride semiconductor device of claim 14, wherein said first HEMT is disposed on a silicon substrate.

20. The III-nitride semiconductor device of claim 14, wherein said solderable front metal is soldered to conductive traces of a circuit board for implementing a DC-DC conversion circuit.

* * * * *